United States Patent [19]

Sato

[11] Patent Number: 5,042,045
[45] Date of Patent: Aug. 20, 1991

[54] RIDGE-WAVEGUIDE SEMICONDUCTOR LASER

[75] Inventor: Fumihiko Sato, Ootsu, Japan

[73] Assignee: Omron Corporation, Kyoto, Japan

[21] Appl. No.: 482,922

[22] Filed: Feb. 22, 1990

[30] Foreign Application Priority Data

Feb. 28, 1989 [JP] Japan .................................... 1-49689

[51] Int. Cl.$^5$ ................................................ H01S 3/19
[52] U.S. Cl. ........................................ 372/46; 372/45; 357/17
[58] Field of Search ........................ 372/46, 45; 357/17

[56] References Cited

U.S. PATENT DOCUMENTS 4,694,460  9/1987  Hayakawa et al. .................... 372/46
4,899,349  2/1990  Hayakawa et al. .................... 372/46

Primary Examiner—Georgia Epps
Attorney, Agent, or Firm—Dickstein, Shapiro & Morin

[57] ABSTRACT

A semiconductor laser includes a substrate (11) on which there are successively formed a first cladding layer (12), an active layer (13), a second cladding layer (14), an etching-stop layer (15) exhibiting little absorptivity with respect to light emitting by the active layer, and a third cladding layer (16). The third cladding layer is etched away down to the etching stop layer with the exception of a ridge portion of the third cladding layer.

6 Claims, 2 Drawing Sheets

RIDGE-WAVEGUIDE SEMICONDUCTOR LASER

BACKGROUND OF THE INVENTION

1. Field of the Invention

This invention relates to a ridge-waveguide semiconductor laser.

2. Description of Related Art

FIG. 2 is a sectional view illustrating the basic construction of a ridge-waveguide semiconductor laser according to the prior art.

As shown in FIG. 2, the conventional ridge-waveguide semiconductor laser includes an n-type GaAs substrate 1, an n-type AlGaAs first cladding layer 2, a GRIN-SCH (Graded-Index Waveguide Separate Confinement Heterostructure) AlGaAs active layer 3, a p-type AlGaAs second cladding layer 4, a p-type AlGaAs third cladding layer 5, and a p-type GaAs cap layer 6.

The construction of this ridge-waveguide semiconductor laser is such that the third cladding layer 5 and cap layer 6 project from the second cladding layer 4, with this protrusion being formed by etching. The etching process entails removing the third cladding layer 5 employing a selective etching solution usually exhibiting selectivity the boundary of which is $x=0.5$ in terms of the Al composition ratio in $Al_xGa_{1-x}As$, and therefore the Al Composition ratio of the second cladding layer 4 is made $x=0.4$ and the Al composition ratio of the third cladding layer 5 is made $x=0.6$.

Accordingly, in the case of the conventional ridge-waveguide semiconductor laser, the Al composition ratio of the second cladding layer 4 cannot be made very high (i.e., no higher than $x=0.5$) on account of the selective etching solution employed. As a result, a short-wavelength lasing-type semiconductor laser cannot be obtained.

More specifically, it is necessary to raise the composition ratio of Al in the active layer 3 in order to shorten the oscillation wavelength of a semiconductor laser. To satisfy the basic requirement that the Al composition ratio in the active layer 3 be smaller than the Al composition ratio in the second cladding layer 4, obviously the Al composition ratio in the second cladding layer 4 must be enlarged.

SUMMARY OF THE INVENTION

An object of the present invention is to provide a ridge-waveguide semiconductor laser in which the Al composition ratio of the cladding layer is raised to make possible short-wave oscillation.

According to the present invention, the foregoing object is attained by providing a ridge-waveguide semiconductor laser in which a first cladding layer is provided on one side and a second cladding layer on the other side of an active layer, an etching-stop layer which will not absorb light is provided on the second cladding layer, a third cladding layer is provided on the etching-stop layer, and the third cladding layer is etched away leaving a portion thereof behind. The result is a ridge-waveguide semiconductor laser.

In accordance with the arrangement of the present invention, the presence of the etching-stop layer allows only the third cladding layer to be selectively etched irrespective of the Al composition ratio of the second cladding layer. This makes it possible to raise the Al composition ratio of the second cladding layer. In addition, since the etching-stop layer does not absorb light, the light from the active layer will not be absorbed by the etching-stop layer.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

An embodiment of the present invention will now be described in detail with reference to FIG. 1, which is a sectional view of a ridge-waveguide semiconductor laser according to the invention.

Figure 1:
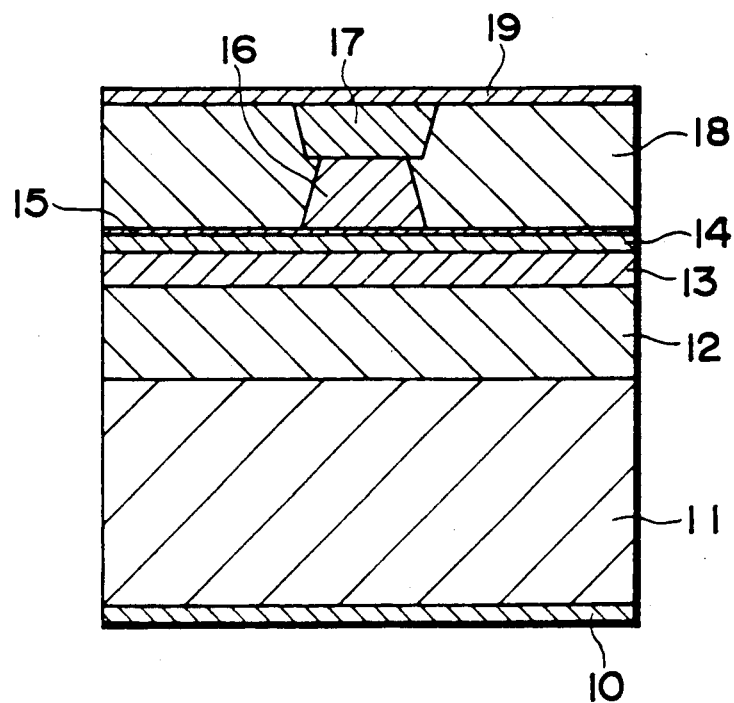
FIG. 1 is a sectional view illustrating an embodiment of a ridge-waveguide semiconductor laser according to the present invention.
Figure 2:
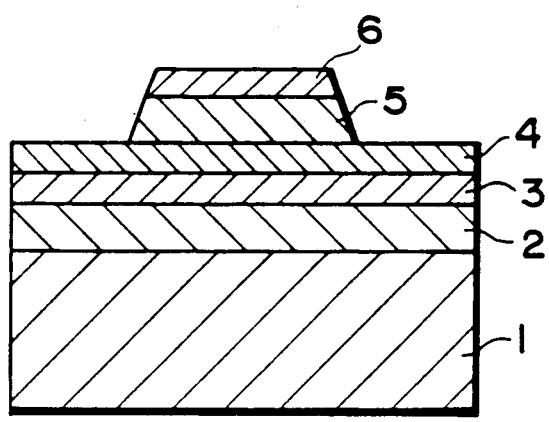
FIG. 2 is a sectional view illustrating an example of the prior art.

As shown in FIG. 1, the ridge-waveguide semiconductor laser includes a three-layer Au/Ge/Ni n-side electrode 10, an n-type GaAs substrate 11, an n-type AlGaAs first cladding layer 12, a GRIN-SCH AlGaAs active layer 13, a p-type AlGaAs second cladding layer 14, a short-period superlattice layer 15 serving as an etching-stop layer and comprising a GaAs layer and an AlGaAs layer, a p-type AlGaAs third cladding layer 16, a p-type GaAs cap layer 17, a polyimide resin 18, and a two-layer Cr/Au p-side electrode 19. The present invention is characterized in that the short-period superlattice layer 15, which serves as a non-light absorptive etching-stop layer comprising the GaAs layer and the AlGaAs layer, is provided on the second cladding layer 14.

The constitution and operation of the present invention will be elucidated along with the description of the manufacturing procedure.

First, a wafer is formed by successively growing the first cladding layer 12, active layer 13, second cladding layer 14, short-period superlattice layer 15, a third cladding layer 16 and cap layer 17 on the substrate 11 by molecular beam epitaxy (MPE) or metal-organic chemical vapour deposition (MO-CVD).

The short-period superlattice layer 15 is formed by alternately laminating a number of GaAs layers and AlGaAs layers, each of which comprises a layer of 4 to 5 molecules. The short-period superlattice layer 15 possesses corrosion resistance with respect to the etching solution owing to the presence of the GaAs layer as well as low light absorptivity owing to the presence of the AlGaAs layer. Since it exhibits low light absorptivity, the short-period superlattice layer 15 does not absorb the light from the active layer 13 and therefore does not impair the light-emitting action of the active layer 13.

The wafer composed of the integrated layers described above has its top surface (the surface of the cap layer 17) masked with an Az resist having a shape of a stripe with a width of 5 μm, by way of example, and the wafer is etched using an etching solution composed of $1H_2SO_4 + 8H_2O_2 + 8H_2O$. Basically, this etching process is performed in order to remove the unnecessary portion of the cap layer 17 (i.e., to leave the central part of the cap layer 17 by removing the portions on both sides of it as viewed in FIG. 1), and the process is so controlled that etching will not reach the short-period superlattice layer 15.

After the resist is removed, etching is carried out using an etching solution composed of HF+10H$_2$O. In this etching step, the cap layer 17 whose central portion remains performs a masking function so that the central portion of the third cladding layer 16 remains while the portions on both sides of the third cladding layer 16 are etched away down to the short-period superlattice layer 15.

Next, the peripheries of the centrally remaining cap layer 17 and third cladding layer 16 are filled with the polyimide resin 18, the p-side electrode 19 is affixed to the top surface and the n-side electrode 10 is affixed to the bottom surface, thereby completing the fabrication of the ridge-waveguide semiconductor laser.

Thus, owing to the presence of the short-period superlattice layer 15 having the etching-stop function, the second and third cladding layers 14, 16 used can have a high Al composition ratio, e.g., x=0.7, irrespective of the selective etching solution, and the Al composition ratio of the active layer 13 can also be made correspondingly high. As a result, it was possible to obtain a ridge-waveguide semiconductor laser capable of high-yield fundamental transverse-mode oscillation at an oscillation wavelength of 780 nm, by way of example.

The short-period superlattice layer 15 will perform the etching-stop function even if an HCL etching solution is used instead of the etching solution consisting of HF+10H$_2$O.

Thus, in accordance with the present invention, the arrangement is such that only the third cladding layer is selectively etched by virtue of the etching-stop layer. Consequently, the Al composition ratio of the second cladding layer is unaffected by the selective etching solution, so that the Al composition ratio of the second cladding layer can be raised, thereby making it possible to raise the Al composition ratio of the active layer. As a result, it is possible to obtain a ridge-waveguide semiconductor laser capable of short wave lasing. Furthermore, since the etching-stop layer does not exhibit light absorptivity, the light from the active layer is not absorbed. This makes it possible for the light-emitting action of the active layer to be well maintained.

As many apparently widely different embodiments of the present invention can be made without departing from the spirit and scope thereof, it is to be understood that the invention is not limited to the specific embodiments thereof except as defined in the appended claims.

What is claimed is:

1. In a semiconductor laser comprising:
    a substrate;
    a first cladding layer formed on said substrate;
    an active layer formed on said first cladding layer;
    a second cladding layer formed on said active layer;
    an etching-stop layer formed on said second cladding layer and exhibiting little absorptivity with respect to light emitting by said active layer, said etching-stop layer comprising a first layer having corrosion resistance with respect to etching solution and a second layer having light absorptivity lower than that of said first layer; and
    a third cladding layer formed on said etching-stop layer;
    said third cladding layer being etched away down to said etching-stop layer in such a manner that a ridge portion of said third cladding layer remains.

2. The semiconductor laser according to claim 1, wherein a cap layer is formed on said third cladding layer, and said cap layer and said third cladding layer are removed by etching and the ridge portion thereof remains.

3. The semiconductor laser according to claim 1, wherein the periphery of the ridge portion of said third cladding layer is filled with an insulating layer or high-resistance layer.

4. In a ridge-waveguide semiconductor laser comprising:
    an active layer;
    a first cladding layer provided on one side of said active layer;
    a second cladding layer provided on another side of said active layer;
    an etching-stop layer which will not absorb light provided on said second cladding layer, said etching-stop layer comprising a first layer having corrosion resistance with respect to etching solution and a second layer having light absorptivity lower than that of said first layer; and
    a third cladding layer provided on said etching stop layer;
    said third cladding layer being etched away leaving a portion thereof behind covering part of said etching-stop layer.

5. The semiconductor laser according to claim 1, wherein said etching-stop layer is a short-period lattice layer formed by alternately laminating a number of said first and second layers.

6. The semiconductor laser according to claim 4, wherein said etching-stop layer is a short-period lattice layer formed by alternately laminating a number of said first and second layers.

* * * * *